US007675445B2

(12) United States Patent
Robbe et al.

(10) Patent No.: US 7,675,445 B2
(45) Date of Patent: Mar. 9, 2010

(54) METHOD AND DEVICE FOR ANALOG-DIGITAL CONVERSION OF A COMPLEX SIGNAL

(75) Inventors: Michel Robbe, Conflans Ste Honorine (FR); Stéphane Doucet, Paris (FR); Hervé Guegnaud, Maurepas (FR)

(73) Assignee: Eads Secure Networks, Montigny le Bretonneux (FR)

( * ) Notice: Subject to any disclaimer, the term of this patent is extended or adjusted under 35 U.S.C. 154(b) by 368 days.

(21) Appl. No.: 11/576,435

(22) PCT Filed: Sep. 19, 2005

(86) PCT No.: PCT/EP2005/011130

§ 371 (c)(1),
(2), (4) Date: Mar. 30, 2007

(87) PCT Pub. No.: WO2006/034880

PCT Pub. Date: Apr. 6, 2006

(65) Prior Publication Data

US 2009/0015452 A1      Jan. 15, 2009

(30) Foreign Application Priority Data

Sep. 30, 2004   (FR) .................................. 04 10368

(51) Int. Cl.
*H03M 1/00*   (2006.01)
(52) U.S. Cl. ........................................ 341/142; 341/155
(58) Field of Classification Search ................. 341/142, 341/143, 155, 141; 375/332, 316
See application file for complete search history.

(56) References Cited

U.S. PATENT DOCUMENTS

| 5,068,660 | A | 11/1991 | Swanson et al. |
| 6,590,943 | B1 * | 7/2003 | Ali .............................. 375/332 |
| 7,227,482 | B2 * | 6/2007 | San et al. ..................... 341/143 |
| 2006/0087362 | A1 * | 4/2006 | O'Halloran et al. ......... 327/427 |

FOREIGN PATENT DOCUMENTS

EP      0 368 610       11/1988

OTHER PUBLICATIONS

Stephen A. Jantzi, et al., "Quadrature Bandpass Delta-Sigman Modulation for Digital Radio", *IEEE Journal*, Dec. 12, 1997.

* cited by examiner

*Primary Examiner*—Rexford N Barnie
*Assistant Examiner*—Joseph Lauture
(74) *Attorney, Agent, or Firm*—Miller, Matthias & Hull

(57) ABSTRACT

In order to convert a complex analog signal into a complex digital signal in an analog-digital conversion device having two channels, I and Q respectively, in quadrature, each comprising an input and an associated output, each output being fed back onto said associated input so as to form a first and a second feedback loops each comprising a digital-analog converter, the device comprising a complex filter with a first stage and a last stage, after sampling (508), a signal integration is performed in a first stage (501) of the filter without introducing any substantial delay. Then, an integration is performed in the last stage (502) of the filter. A substantial delay (507) is then introduced and the output signal of the last stage is converted into a digital signal over several bits. The digital signal is injected into the feedback loop (108) of said channel and the digital signal is converted into a feedback signal.

12 Claims, 8 Drawing Sheets

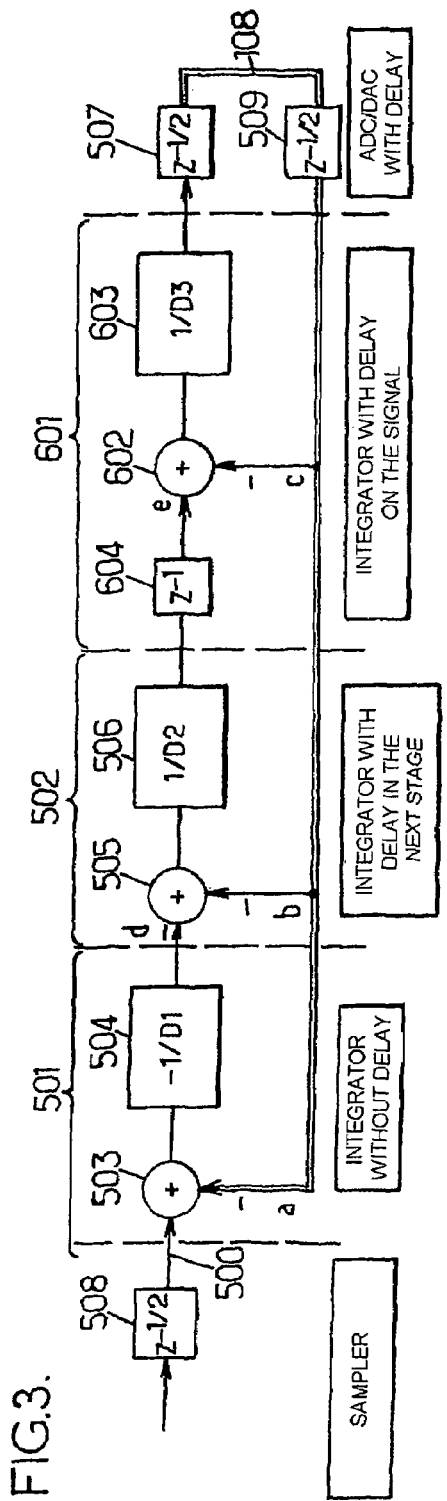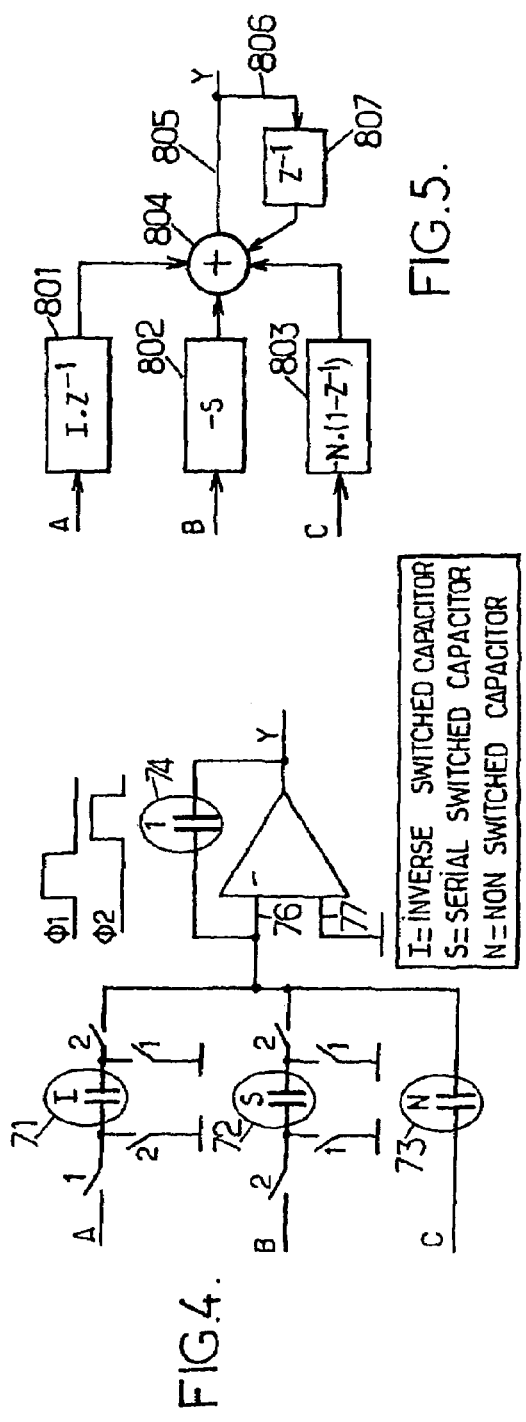

FIG.9A.
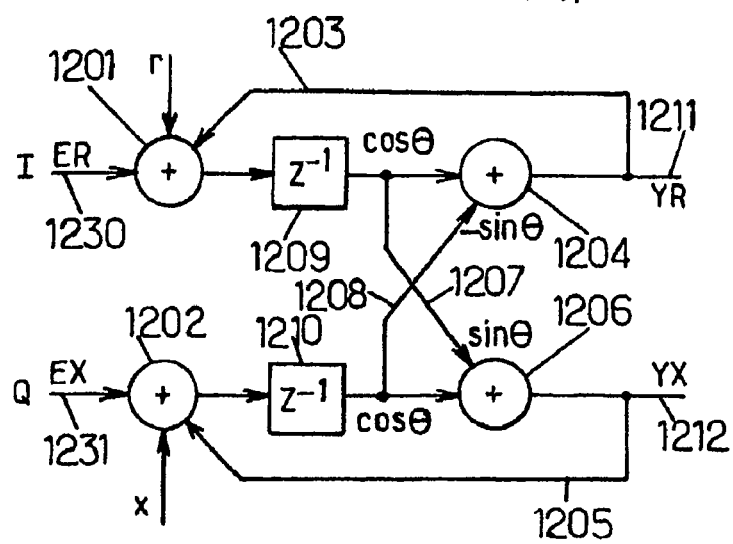
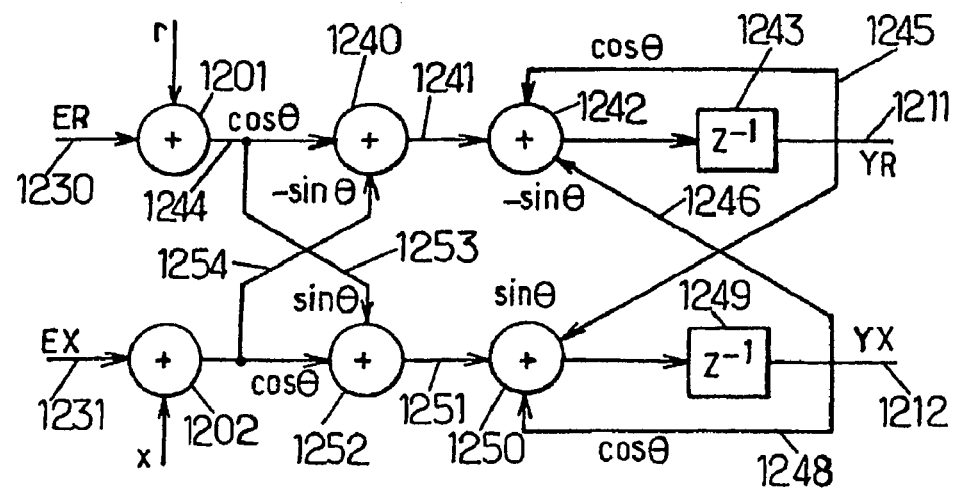
FIG.9B.

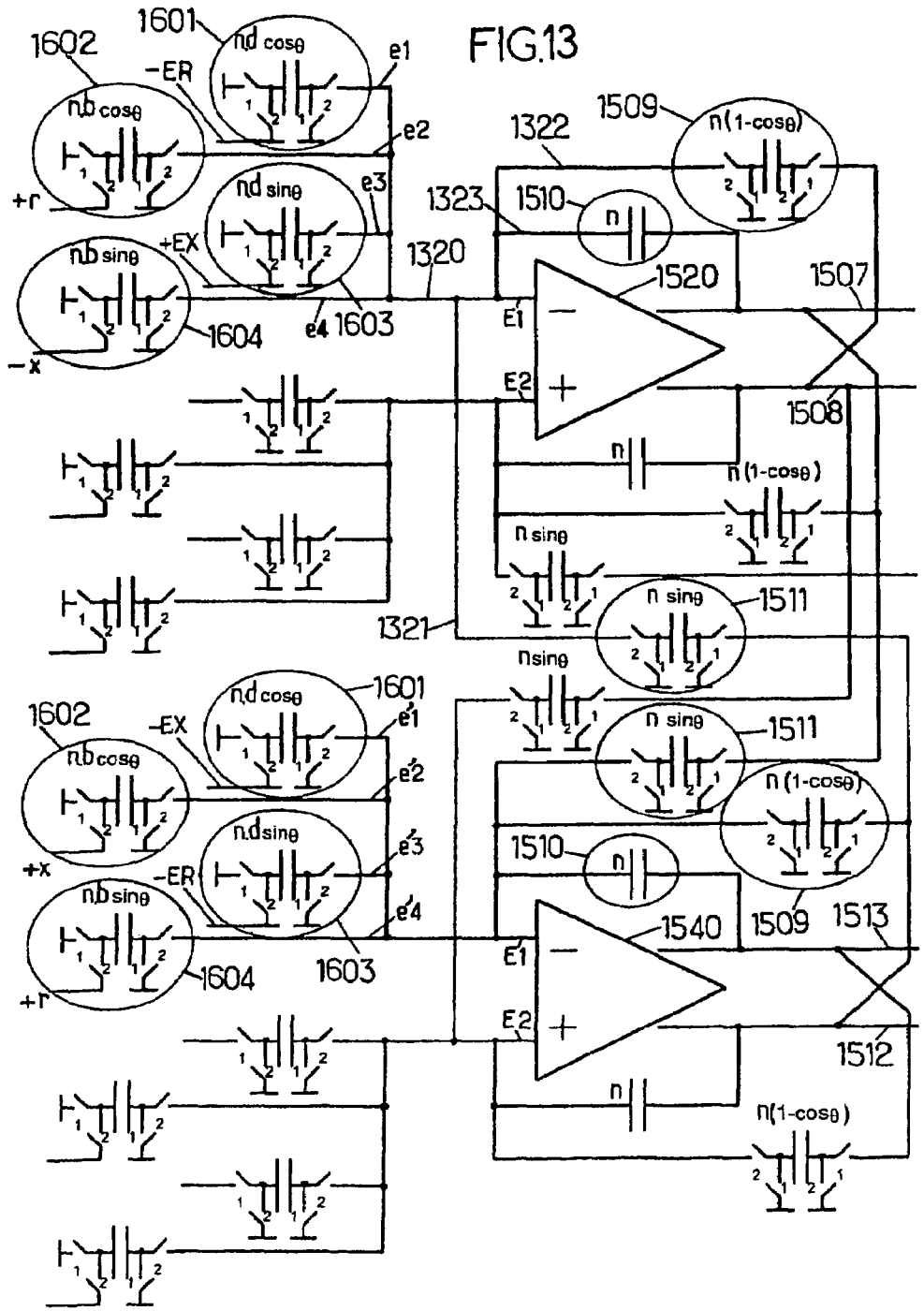

METHOD AND DEVICE FOR ANALOG-DIGITAL CONVERSION OF A COMPLEX SIGNAL

CROSS-REFERENCE TO RELATED APPLICATION

This is the U S National Phase of International Application No. PCT/FR2005/011130 filed 10 Sep. 2005, claiming priority to French Patent No. FR 04 10368, filed on 30 Sep. 2004

1. Field of the Disclosure

The present invention relates to complex signal analog-digital converters, having two channels in quadrature. More particularly, the invention addresses the problem of the thermal noise in a complex bandpass converter.

2. Background of the Disclosure

One of the known analog-digital converters is the Sigma-Delta analog-digital converter. These converters exhibit an over-sampling frequency well above the Nyquist frequency of the input signal and, for this reason, allow a high resolution to be obtained for a relatively low cost.

Converters of this type also allow the quantization noise to be rejected outside of the useful frequency band of the output signal, which band has a central frequency $f_0$. Indeed, in such a converter, the quantization noise is controlled by a combined action of the feedback loop signals and of a complex filter.

Bandpass Sigma-Delta converters can convert complex analog signals into complex digital signals. They therefore have two channels in quadrature, conventionally referenced I (for 'In phase') and Q (for 'Quadrature').

The latter have advantages over real signal converters in terms of stability and bandpass bandwidth.

It is noted that, in the figures, the double-lined arrows represent the two channels I and Q of the complex converters.

FIG. 1 illustrates a complex bandpass Delta-Sigma converter, for converting a complex analog signal into a complex digital signal. Such a converter comprises two channels I and Q in quadrature. Each channel comprises an input 101, 102. The signal entering by the input 101, 102 is added by an adder 103, 104 to the signal from a feedback loop 114, 115. The signal then passes through a complex filter 105. It is then processed by an analog-digital converter 106, 107 before being delivered onto outputs 116, 109. The feedback loops each comprise a digital-analog converter 112, 113 for supplying the feedback signal 114, 115 from a signal 110, 111 corresponding to the output signal 116, 109.

The two channels I and Q of such a converter can also be schematically indicated by a double line as illustrated in other figures. In this case, reference is made to one feedback loop of the converter 108.

The performance of such converters depends on the 'Signal/Noise' ratio (or S/N ratio). Consequently, the noise introduced during the processing of the signal in a Sigma-Delta converter must be as low as possible. A complex bandpass Sigma-Delta converter advantageously rejects the quantization noise of the signal outside of the frequency band of the useful signal at the output of the converter. In a high-performance converter of this type, the quantization noise is, consequently, relatively low with respect to the thermal noise which therefore provides a non-negligible contribution to the S/N ratio.

In such a converter, the thermal noise originates notably from the amplifiers of the converter.

The thermal noise can also be generated by a series resistance of the converter switches and, in that case, it is linked to the values of the switched capacitors of these switches by the following equation:

$$B = KT/C$$

where B is the thermal noise, K is Boltzmann's constant, T is the temperature and C corresponds to the capacitor value.

Capacitor values that allow the thermal noise to be reduced can then be chosen. Indeed, since the thermal noise generated by a capacitor is inversely proportional to the capacitor value, capacitors with large values can be selected in order to reduce the thermal noise. However, this reasoning soon shows limits since the power consumption of a capacitor is directly linked to the capacitor value and consequently problems of power consumption are then posed.

The document 'Quadrature Bandpass Delta-Sigma Modulation for Digital Radio', Stephen A. Jantzi, IEEE, 12 Dec. 1997, proposes a complex Sigma-Delta converter comprising a complex filter (FIG. 11) based on switched capacitors whose values have been calculated so as to reduce the thermal noise generated. In a complex filter of this type with four stages, it is noted that a switched capacitor introducing a substantial delay in the processed signal is placed before the outputs of the first three stages ($C_{x2}$, $C_{x3}$, $C_{x4}$).

As previously stated, each capacitor generates a noise that is inversely proportional to its capacitor value.

In such a complex filter structure with feedback loop, the noise of a stage is divided by the gain of the preceding stages. Thus, the noise generated by the delay capacitors of the second stage and of the third stage, respectively, is divided by the gain of the first and of the second stages, respectively. On the other hand, the noise generated by the capacitor $C_{x2}$ at the output of the first stage is directly added to the total noise of the complex filter.

SUMMARY OF THE DISCLOSURE

The present invention aims to further improve the performance of a complex bandpass Sigma-Delta converter based on this principle by reducing the thermal noise in the complex filter.

The invention starts with the observation that a substantial delay introduced into one stage of the complex filter of a converter generates a thermal noise and that this thermal noise is divided by the gain of the stages preceding the stage into which the delay is introduced by a negative feedback effect of the feedback loops of a Sigma-Delta converter.

Thus, advantageously, a first aspect of the invention proposes a conversion method for an analog-digital conversion device having two channels I and Q respectively, in quadrature, each comprising an input and an associated output, for converting a complex analog input signal into a complex digital output signal by an analog-digital converter, each output being fed back onto said associated input so as to form a first and a second feedback loops each comprising a digital-analog converter, said device comprising a complex filter with a first stage and a last stage.

The method comprises, on each of the channels I and Q, the steps consisting in:

sampling an analog input signal;

performing an integration of the sampled signal in said first stage of the filter in order to deliver an output signal from the first stage, said integration not introducing any substantial delay;

performing a signal integration in the last stage of the filter in order to deliver an output signal from the last stage;

introducing a substantial delay and converting the output signal from the last stage into a digital signal over several bits by said analog-digital converter;

injecting said digital signal into the feedback loop of said channel;

converting the digital signal into a feedback signal by said digital-analog converter;

injecting said feedback signal into at least said first stage of said complex filter.

Thanks to these dispositions, no substantial delay is introduced into the signal during the processing of the signal in the first stage of the filter. In order to compensate for the absence of such a delay in the signal processing of the first stage of the filter, a delay is introduced at the output of the filter. Thus, the delay introduced into the first stage of the complex filter of the prior art converter previously described is displaced to the output of the filter, upstream of the analog-digital converter, in order to allow a conversion of the analog signal into a digital signal. In one embodiment of the invention, such a delay may be introduced at the input of the analog-digital converter itself.

The result of this is that the thermal noise generated in the first stage is reduced, which is very advantageous for the performance of a Sigma-Delta converter since the thermal noise of the first stage can thus be reduced, which, in contrast to the thermal noise of the following stages, cannot be divided by the gain of the preceding stages. A complex bandpass Sigma-Delta converter exhibiting a relatively low thermal noise can thus be obtained.

It is noted that a signal processing carried out in one stage of the filter without introducing a substantial delay makes reference to a signal processing that does not introduce any substantial delay into a main channel of the complex filter, given that delays may be introduced into feedback loops without substantially delaying the main channel.

The signal to be injected into the feedback loop is delayed by a unity delay. Such a unity delay may be divided up by introducing a substantial delay at the output of the last stage and a substantial delay into the feedback loop such that the sum of these substantial delays corresponds to a unity delay.

It is noted that the term 'unity delay' makes reference to a delay that is of the order of the time required by the analog-digital converter to convert, at the output of the complex filter, the analog signal into a digital signal over several bits. This delay is consequently a substantial delay in the processing of the signal by the complex filter.

In one embodiment of the present invention, the first stage of the complex filter is an integrator with switched capacitors whose capacitor values are relatively high in order to allow a reduction in the thermal noise of the conversion device. The noise of the first stage cannot be divided by the gain of a preceding stage, in contrast to the noise generated by the following stages which can be divided by the negative-feedback effect. It is therefore desirable to reduce the noise of the first stage by choosing relatively high capacitor values. More precisely, these capacitor values are in this case advantageously determined as a function of the level of thermal noise desired for the device.

When the device comprises a link for injecting the feedback signal into each of the stages of the complex filter, the noise generated by the stages, other than the first stage, can be divided by negative-feedback effect. Thus, when the stages of the complex filter, other than the first stage, are switched-capacitor integrators, it may be advantageous to determine the values of these capacitors as a function of a given level of symmetry between the two channels I and Q and/or of a given level of stability of the device.

The step consisting in performing a signal integration in the first stage of the complex filter can be carried out by performing the following steps consisting in:

adding together the following signals on the channel I:
  the input signal of the channel I,
  the feedback signal of the channel I,
  the output signal of the first stage of the channel I substantially delayed and multiplied by a coefficient $1/G$,
  the output signal of the first stage of the channel I substantially delayed and multiplied by a coefficient of value $1/G*(\cos\theta-1)$, and
  the output signal of the first stage of the channel Q substantially delayed and multiplied by a coefficient $1/G*(-\sin\theta)$;

adding together the following signals on the channel Q:
  the input signal of the channel Q,
  the feedback signal of the channel Q,
  the output signal of the channel Q of the first stage substantially delayed and multiplied by a coefficient of value $1/G$,
  the output signal of the channel Q of the first stage substantially delayed and multiplied by a coefficient of value $1/G*(\cos\theta-1)$, and
  the output signal of the channel I of the first stage substantially delayed and multiplied by a coefficient $1/G*(\sin\theta)$;

where $\theta$ is equal to $2\pi f_Z/f_S$, where $f_Z$ is a frequency corresponding to a zero of the transfer function of the filter and $f_S$ is the sampling frequency of the signal; where G is the gain of the first stage.

It is noted that the transfer function of the filter can have several different zeros. In this case, $\theta$ corresponds to one of the zeros of the transfer function. The symbol $\theta$ can correspond to different zeros in different stages.

The step consisting in performing a signal integration in a stage other than the first stage, in a filter of order greater than or equal to 2, can be carried out by performing the following steps consisting in:

adding together the following signals on the channel I:
  the output signal of the preceding stage of the channel I multiplied by a coefficient of value $d \cos\theta$,
  the feedback signal of the channel I multiplied by a coefficient of value $b \cos\theta$,
  the output signal of the preceding stage of the channel Q multiplied by a coefficient $-d \sin\theta$,
  the feedback signal of the channel Q multiplied by a coefficient of value $-b \sin\theta$,
  the output signal of the last stage of the channel Q substantially delayed and multiplied by a coefficient $-\sin\theta$;
  the output signal of the last stage of the channel I substantially retarded and multiplied by a coefficient of value $\cos\theta-1$; and
  the output signal of the last stage of the channel I substantially retarded;

adding together the following signals on the channel Q:
  the output signal of the preceding stage of the channel Q multiplied by a coefficient of value $d \cos\theta$;
  the feedback signal of the channel Q multiplied by a coefficient of value $b \cos\theta$;
  the output signal of the preceding stage of the channel I multiplied by a coefficient $d \sin\theta$;
  the feedback signal of the channel I multiplied by a coefficient of value $b \sin\theta$;
  the output signal of the last stage of the channel I substantially delayed and multiplied by a coefficient $\sin\theta$;

the output signal of the last stage of the channel Q substantially retarded and multiplied by a coefficient of value cos θ-1; and the output signal of the last stage of the channel I substantially retarded;

where θ is equal to $2\pi f_Z/f_S$, where $f_Z$ is a frequency corresponding to a zero of the transfer function of the filter and $f_S$ is the sampling frequency of the signal and where b and d are numbers that are strictly positive.

In the case where the stage in question is a second stage of a complex filter according to the invention, advantageously, the signal at the input of this stage is substantially delayed.

In the case where the stage in question is one of the stages following the second stage of a complex filter according to the invention, the signal at the output of this stage is then substantially delayed.

It is noted that when the transfer function of the complex filter has several different zeros, it is advantageous that θ corresponds to different zeros in different stages of the filter.

It is noted that the complex signal analog-digital bandpass Sigma-Delta converter is a multi-bit converter. Thus, the feedback signals in the feedback loops are over several bits and the control can be effected with a relatively high precision.

A second aspect of the invention proposes a multi-bit analog-digital conversion device having two channels I and Q, respectively, in quadrature, each comprising an input and an associated output, for converting a complex analog input signal into a complex digital output signal over several bits, each output being fed back onto said associated input so as to form a first and a second feedback loops each comprising a digital-analog converter.

The device comprises:
a complex filter comprising a first stage and a last stage, said first stage comprising an integrator without substantial delay;
an analog-digital converter on each of the channels for converting the signal at the output of the complex filter;
an element with substantial delay disposed at the input of the analog-digital converter.

In one embodiment of the present invention, the first stage of the filter is an integrator with switched capacitors, and the values of the switched capacitors of the first stage are relatively high. They can advantageously be determined as a function of a desired level of thermal noise for the device.

When the device comprises a link for injecting the feedback signal into each of the stages of the complex filter, the thermal noise generated by the various stages other than the first stage can be reduced by negative-feedback effect. Thus, when the stages of the device, other than the first stage, are switched-capacitor integrators, it can then be advantageous to determine the values of these capacitors as a function of a given level of symmetry of the two channels I and Q, and/or of a given level of stability of the device.

In one embodiment of the present invention, the first stage of the complex filter comprises a first operational amplifier and, respectively, a second operational amplifier on the channel I and channel Q, respectively, each of the amplifiers comprising a first input and a second input, complementary to said first input, together with a first output and a second output, complementary to said first output.

The first input of the first operational amplifier receiving an input signal on the channel I is connected to:
the feedback loop of the channel I via a link comprising a unit with switched capacitor of value k;
the first output of the first operational amplifier via a feedback loop comprising a capacitor of value k/G;

the second output of the first operational amplifier via a feedback loop comprising a switched-capacitor unit including a capacitor of value k/G*(1−cos θ); and
the second output of the second operational amplifier via a feedback loop comprising a switched-capacitor unit including a capacitor of value k/G*sin θ.

The second input of the first operational amplifier is designed to deliver a signal that is complementary to the signal delivered at the first output of the first operational amplifier.

The first input of the second operational amplifier receiving an input signal on the channel Q is connected to:
the feedback loop of the channel Q via a link comprising a unit with switched capacitor of value k;
the first output of the second operational amplifier via a feedback loop comprising a capacitor of value k/G;
the second output of the second operational amplifier via a feedback loop comprising a switched-capacitor unit including a capacitor of value k/G*(1−cos θ); and
the first output of the first operational amplifier via a feedback loop comprising a switched-capacitor unit including a capacitor of value k/G*sin θ;

where θ is equal to $2\pi f_Z/f_S$, where $f_Z$ is a frequency corresponding to a zero of the transfer function of the filter and $f_S$ is the sampling frequency of the signal; where G is the gain of the first stage; where k is a number that is strictly positive; the capacitors of said switched-capacitor units included in the feedback loops charge, or respectively discharge, while the capacitors of the other switched-capacitor units discharge, or charge, respectively.

The second input of the second operational amplifier is designed to deliver a signal that is complementary to the signal delivered at the first output of the second operational amplifier.

It is noted that k is a number that is strictly positive relating to dimensions of capacitor. It can be expressed in Farads.

Advantageously, the switched-capacitor unit in the link between the first input of the first operational amplifier, and respectively of the second operational amplifier, and the feedback loop of the channel I may also be used for sampling the input signal of the channel I, and similarly, the switched-capacitor unit in the link between the second input of the first operational amplifier, and respectively of the second operational amplifier, and the feedback loop of the channel Q may also be used for sampling the input signal of the channel Q. Thus, the number of capacitors used may be reduced and, consequently, the generated noise further reduced.

In one embodiment of the invention, the complex filter is of order strictly greater than 2. One of the stages that follows the second stage of the complex filter comprises a first operational amplifier, and respectively a second operational amplifier, on the channel I and channel Q, respectively, each of the amplifiers comprising a first input and a second input complementary to said first input, together with a first output and a second output, complementary to said first output;

the feedback loops each comprising a main channel for a feedback signal and a complementary channel for a complementary feedback signal;

the preceding stage delivering a first output of the channel I and, respectively, of the channel Q, and a second complementary output of the channel I and of the channel Q, respectively;

the first input of the first operational amplifier being connected to:

the first output of the channel I of the preceding stage via a link comprising a switched-capacitor unit including a capacitor of value n*e cos θ;

the main channel of the feedback loop of the channel I via a link comprising a switched-capacitor unit including a capacitor of value n*c cos θ;

the second output of the channel Q of the preceding stage via a link comprising a switched-capacitor unit including a capacitor of value n*e sin θ;

the complementary channel of the feedback loop of the channel Q via a link comprising a switched-capacitor unit including a capacitor of value n*c sin θ;

the second output of the second operational amplifier via a link comprising a switched-capacitor unit comprising a capacitor of value n*sin θ;

the second output of the first operational amplifier via a link comprising a switched-capacitor unit comprising a capacitor of value n*(1−cos θ);

the first output of the first operational amplifier via a link comprising a capacitor of value n;

the second input of the first operational amplifier being designed to deliver a signal that is complementary to the signal delivered at the first output of the first operational amplifier;

the first input of the second operational amplifier being connected to:

the first output of the channel Q of the preceding stage via a switched-capacitor unit comprising a capacitor of value n*e cos θ;

the main channel of the feedback loop of the channel Q via a link comprising a switched-capacitor unit comprising a capacitor of value n*c cos θ;

the first output of the channel I of the preceding stage via a link comprising a switched-capacitor unit comprising a capacitor of value n*e sin θ;

the main channel of the feedback loop of the channel I via a link comprising a switched-capacitor unit comprising a capacitor of value n*c sin θ;

the first output of the first operational amplifier via a link comprising a switched-capacitor unit comprising a capacitor of value n*sin θ;

the second output of the second operational amplifier via a link comprising a switched-capacitor unit comprising a capacitor of value n(1−cos θ);

the first output of the second operational amplifier via a link comprising a capacitor of value n;

where θ is equal to $2\pi f_Z/f_S$, where $f_Z$ is a frequency corresponding to a zero of the transfer function of the filter and $f_S$ is the sampling frequency of the signal;

where G is the gain of the first stage; where c, e, n are numbers that are strictly positive; the capacitors of said switched-capacitor units comprised in feedback loops being charged, respectively discharged, while the capacitors of the other switched-capacitor units being discharged, respectively charged;

the second input of the second operational amplifier being designed to deliver a signal that is complementary to the signal delivered at the first output of the second operational amplifier.

It is noted that n is a number that is strictly positive relating to dimensions of capacitor. It can be expressed in Farads.

In one embodiment, a second stage of the complex filter comprises a first operational amplifier, and respectively a second operational amplifier, on the channel I and channel Q, respectively, each of the amplifiers comprising a first input and a second input complementary to said first input, together with a first output and a second output, complementary to said first output;

the feedback loops each comprising a main channel for a feedback signal and a complementary channel for a complementary feedback signal;

the first stage delivering a first output of the channel I and, respectively, of the channel Q, and a second complementary output of the channel I and of the channel Q, respectively;

the first input of the first operational amplifier being connected to:

the second output of the channel I of the first stage via a link comprising a switched-capacitor unit including a capacitor of value n*d cos θ;

the main channel of the feedback loop of the channel I via a link comprising a switched-capacitor unit including a capacitor of value n*b cos θ;

the first output of the channel Q of the first stage via a link comprising a switched-capacitor unit including a capacitor of value n*d sin θ;

the complementary channel of the feedback loop of the channel Q via a link comprising a switched-capacitor unit including a capacitor of value n*b sin θ;

the second output of the second operational amplifier via a link comprising a switched-capacitor unit comprising a capacitor of value n*sin θ;

the second output of the first operational amplifier via a link comprising a switched-capacitor unit comprising a capacitor of value n*(1−cos θ);

the first output of the first operational amplifier via a link comprising a capacitor of value n;

the second input of the first operational amplifier being designed to deliver a signal that is complementary to the signal delivered at the first output of the first operational amplifier;

the first input of the second operational amplifier being connected to:

the second output of the channel Q of the first stage via a switched-capacitor unit comprising a capacitor of value n*d cos θ;

the main channel of the feedback loop of the channel Q via a link comprising a switched-capacitor unit comprising a capacitor of value n*b cos θ;

the second output of the channel I of the first stage via a link comprising a switched-capacitor unit comprising a capacitor of value n*d sin θ;

the main channel of the feedback loop of the channel I via a link comprising a switched-capacitor unit comprising a capacitor of value n*b sin θ;

the first output of the first operational amplifier via a link comprising a switched-capacitor unit comprising a capacitor of value n*sin θ;

the second output of the second operational amplifier via a link comprising a switched-capacitor unit comprising a capacitor of value n(1−cos θ);

the first output of the second operational amplifier via a link comprising a capacitor of value n;

where θ is equal to $2\pi f_Z/f_S$, where $f_Z$ is a frequency corresponding to a zero of the transfer function of the filter and $f_S$ is the sampling frequency of the signal;

where G is the gain of the first stage; where b, d, n are numbers that are strictly positive; the capacitors of said switched-capacitor units comprised in feedback loops being charged, respectively discharged, while the capacitors of the other switched-capacitor units being discharged, respectively charged;

the second input of the second operational amplifier being designed to deliver a signal that is complementary to the signal delivered at the first output of the second operational amplifier;

signals received by said switched-capacitor units being transmitted with no delay to the respective inputs of the operational amplifiers.

Other aspects, aims and advantages of the invention will become apparent upon reading the description of one of its embodiments.

BRIEF DESCRIPTION OF THE DRAWINGS

The invention will also be better understood with the aid of the drawings, in which:

FIG. 3 shows a three-stage complex filter of a sigma-delta converter according to one embodiment of the present invention;

FIG. 4 is an implementation circuit diagram of a switched-capacitor integrator;

FIG. 5 is a modeling diagram for the integrator illustrated in FIG. 4;

FIGS. 9-A and 9-B are modeling diagrams of a switched-capacitor integrator with delay according to one embodiment of the present invention;

FIG. 13 is an implementation circuit diagram of a second stage of a complex filter according to one embodiment of the present invention.

DETAILED DESCRIPTION OF THE DISCLOSURE

In the following sections, θ can make reference to different zeros of the transfer function of the complex filter. It is noted that θ may advantageously correspond to different zeros in each of the stages of the filter.

Figure 1:
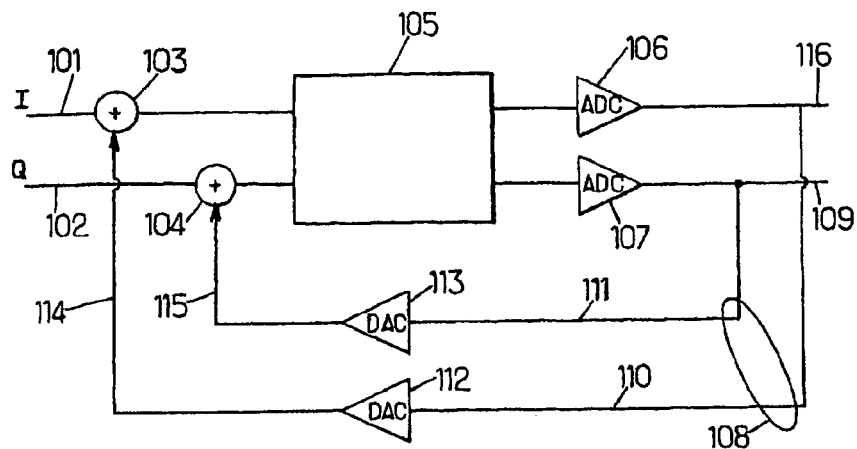
FIG. 1 is a complex bandpass Sigma-Delta analog-digital converter according to the prior art, as previously detailed.
Figure 2:
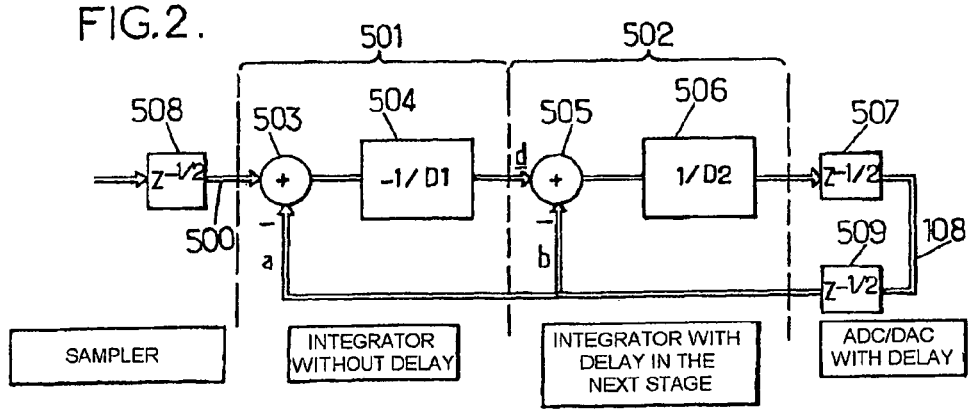
FIG. 2 shows a two-stage complex filter of a sigma-delta converter according to one embodiment of the present invention.

FIG. 2 shows a complex filter of a complex Sigma-Delta analog-digital converter according to one embodiment of the present invention. Such a filter comprises a first stage 501 and a second stage 502, each comprising an adder 503 and 505, respectively, and an integrator 504 and 506, respectively. A delay $Z^{-1/2}$ 508, designed to sample the input signal 500, is disposed at the input of the filter. Then, the adder 503 adds together a sampled signal and the signal from the feedback loop 108 of the converter preferably multiplied by a coefficient −a. The signal obtained at the output of the adder 503 is processed by the integrator 504 then transmitted to the second stage of the complex filter while being multiplied by a coefficient d. It is noted that, advantageously, this first stage 501 does not introduce a substantial delay.

Then, at the input of the second stage 502, the signal is added by the adder 505 to the signal from the feedback loop 108 of the converter multiplied by a coefficient −b. The signal thus obtained at the output of the adder 505 is processed by the integrator 506, then it is converted into a digital signal before being injected into the feedback loop 108 of the converter. A substantial delay 507 is introduced at the output of the last stage of the complex filter and a substantial delay 509 is introduced into the feedback loop 108.

The sum of the substantial delays 507 and 509 preferably corresponds to the time for conversion of the analog signal into a digital signal by the analog-digital converter, in other words a unity delay. Such a unity delay is therefore preferably divided between the output of the last stage of the complex filter and the feedback loop. In such a structure, a substantial delay is not introduced in the first stage of the complex filter but is introduced at the output of the Sigma-Delta converter.

It is noted that a and b are numbers that are strictly positive.

Thus, the thermal noise generated within the complex filter can be reduced.

FIG. 3 shows a third-order complex filter of a complex bandpass Sigma-Delta converter according to one embodiment of the present invention. Such a filter comprises a first stage 501, a second stage 502 and a third stage 601. The first and second stages 501 and 502 have already been described with reference to FIG. 2. In the filter illustrated in FIG. 3, the third stage 601 introduces a delay 604 at the input of the stage. Then, as in reference to FIG. 2, a substantial delay 507 is introduced at the output of the last stage of the complex filter and a substantial delay 509 is introduced in the feedback loop 108.

In FIG. 3, the signal output from the second stage 502 therefore enters the third stage via the delay 604 then is added by an adder 602 to the signal from the feedback loop 108 of the converter multiplied by a coefficient −c. The signal thus obtained is then processed by an integrator 603 before being converted into a digital signal. The digital signal is subsequently injected into the feedback loop 108.

It is noted that c is a number that is strictly positive.

Thus, the first stage does not introduce any substantial delay. Consequently, the thermal noise is reduced.

The following sections describe a method for designing such complex filters. In one embodiment of the present invention, a complex filter requires a stage comprising an integrator without substantial delay and a stage comprising an integrator with substantial delay, the delay being displaced to the output of the complex filter of the Sigma-Delta converter. In order to propose an implementation circuit diagram for such a filter, intermediate modeling steps are detailed in the following sections.

Such modeling schemes are based on a modeling of an integrator with switched capacitors such as is represented in FIG. 4. A switched-capacitor integrator conventionally operates over a period comprising two phases controlled by one of the control signals φ1, φ2.

A first phase corresponds to a half-period during which the signal φ1 is active and the signal φ2 is inactive (switches 1 closed and switches 2 open). Then, a second phase corresponds to the other half-period during which the signal φ2 is active and the signal φ1 is inactive (switches 1 open and switches 2 closed). Depending on the arrangement of such a switched-capacitor unit, input signals charge up capacitors during one of the operational phases. The following sections detail some of the possible operating modes.

Such an integrator possesses three different types of inputs. A first type of input, referenced I for 'Inverse', a second type of input referenced S for 'Serial' and a third type of input referenced N for 'Non-switched'. In one asymmetrical representation known as 'single-ended', these three inputs are connected to an input 76 of an operational amplifier 75, the other input 77 being connected to ground. The operational amplifier has an output Y which is fed back onto its input 76, the feedback loop comprising an integration capacitor 74. The value of the integration capacitor is taken as a unity reference for the other capacitor values of the integrator, its value is therefore denoted as 1.

The input of the I type comprises a capacitor 71 charged up by an input signal A during the first phase of operation of the integrator then discharged onto the integration capacitor 74 during the second phase of operation. Thus, this input introduces a substantial delay into the signal and amplifies the signal with a coefficient corresponding to the value of the capacitor 71. The value of capacitor 71 is denoted I.

The input of type S also comprises a capacitor 72 which is charged up by an input signal B during the second phase of operation of the integrator, and the signal B is also integrated during this second phase. Thus, the signal B is not substantially delayed, and it is multiplied by a coefficient corresponding to the value of the capacitor 72. The value of the capacitor 72 is denoted S.

The input of type N comprises a capacitor 73 which is directly charged up by an input signal C whatever the phase of operation of the integrator. The signal is multiplied by a coefficient corresponding to the value of the capacitor 73. The value of the capacitor 73 is denoted N.

Such an integrator can thus be represented by a modeling such as that illustrated in FIG. 5.

The modeling illustrated in FIG. 5 comprises three inputs each respectively including a unit 801, a unit 802 and a unit 803 each modeling the processing of the signal entering each of the inputs of the switched-capacitor integrator in FIG. 4. Then, at the output of these units, an adder 804, with an output 805 fed back onto one input of the adder, adds together the signals at the outputs of the units 801, 802, 803 together with the signal from the feedback loop. The feedback loop comprises a delay unit 807, thus effecting the integration of the signal.

The signal A entering at the input of type I then undergoes an integration with a unity delay 807, denoted $Z^{-1}$. The signal B entering at the input of type S undergoes an integration during the second phase of operation of the integrator. Then, the signal C entering at the input of type N is multiplied by a gain −N without being integrated.

The following equation can then be written:

$$Y = A * \frac{I * Z^{-1}}{1 - Z^{-1}} - B * \frac{S}{1 - Z^{-1}} - C * N$$

where Y is the output signal of the switched-capacitor integrator; and where A, B and C are the input signals of the inputs of type I, S and N, respectively.

Based on this modeling, the following sections detail steps for obtaining a detailed implementation circuit diagram of a complex filter of a multi-bit bandpass complex Sigma-Delta converter according to one embodiment of the present invention.

In the following sections, θ obeys the following equation:

$$\theta = 2\pi f_Z/f_S,$$

where $f_Z$ is the frequency of a zero of the transfer function of the complex filter, and where $f_S$ is the sampling frequency of the signal in the converter.

When the transfer function possesses several zeros, it is advantageous that one of the zeros of the transfer function correspond to each one of the stages.

In the case where $f_Z$ and $f_S$ obey the following equation:

$$f_S = 8 * f_Z$$

then:

$$\theta = \pi/4.$$

The values of the capacitors of the complex integrator without substantial delay and of the complex integrator with delay displaced to the output, such as are detailed in the following sections, are determined on the basis of the transfer function of each of these integrators.

One embodiment of such a filter requires a complex integrator without substantial delay after the sampling of the signal in the first stage of the complex filter.

Figure 6A:
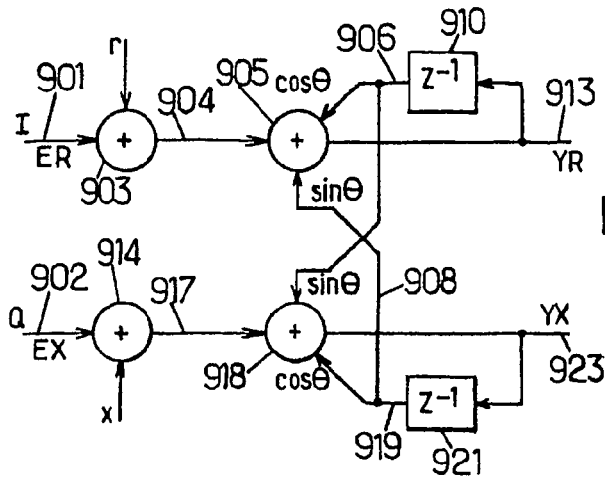
FIGS. 6-A and 6-B are modeling diagrams of a switched-capacitor integrator without delay according to one embodiment of the present invention.
Figure 6B:
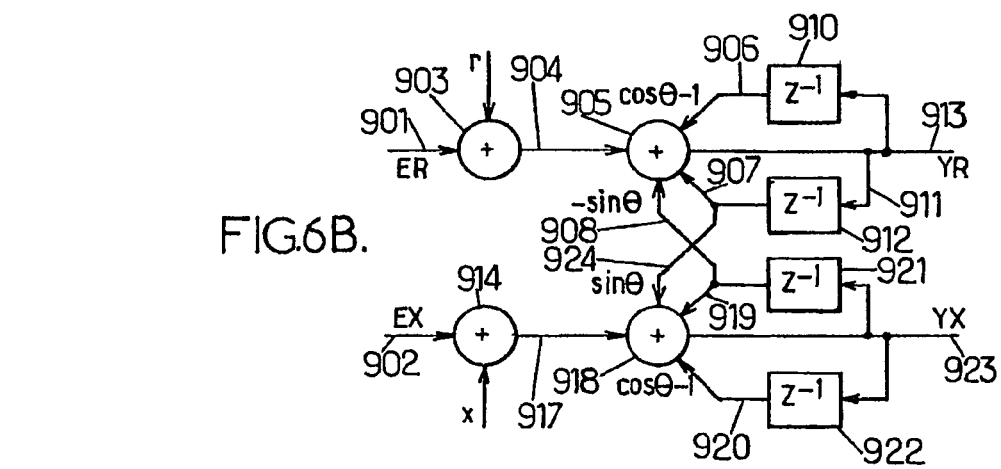

Thus, FIGS. 6-A and 6-B illustrate a two-step modeling of a first stage of a complex filter without substantial delay according to one embodiment of the present invention having a transfer function obeying the following equations:

$$YR = (ER+r) + YR \cos \theta * Z^{-1} - YX \sin \theta * Z^{-1}$$

$$YX = (EX+x) + YX \cos \theta * Z^{-1} + YR \sin \theta * Z^{-1}$$

Then, the following equations are readily obtained:

$$YR(1-Z^{-1}) = (ER+r) + YR(\cos \theta - 1)Z^{-1} - YX \sin \theta * Z$$

and $$YX(1-Z^{-1}) = (EX+x) + YX(\cos \theta - 1)Z^{-1} + YR \sin \theta * Z$$

The output signals of the integrator without delay according to one embodiment of the present invention therefore obey the following equations:

$$YR = [(ER+r) + YR(\cos \theta - 1)Z^{-1} - YX \sin \theta * Z]/(1-Z^{-1})$$

and $$YX = [(EX+x) + YX(\cos \theta - 1)Z^{-1} + YR \sin \theta * Z]/(1-Z^{-1})$$

FIG. 6-A illustrates a first modeling step in which a complex integrator has two inputs 901 and 902. An input signal ER, corresponding to the input signal on the channel I, is input into an adder 903 by which it is added to a signal r from the feedback loop 108 of the converter in order to deliver a signal 904. Subsequently, an adder having an output 913 adds the signal 904 together with a signal 906 coming from a loop fed back from the output 913, the feedback loop comprising a unity delay 910 and multiplying the output signal by the coefficient −cos θ, and finally a signal 908 coming from a loop fed back from the output 923 of the integrator, the feedback loop comprising a unity delay 921 and multiplying the output signal by a coefficient −sin θ.

Then, an input signal EX, corresponding to the input signal on the channel Q, is input into an adder 914 which adds a signal x from the feedback loop of the converter to it in order to deliver a signal 917. Subsequently, an adder 918 adds the signal 917 to a signal 919 coming from a loop fed back from the output 923 of the integrator, the feedback loop comprising the unity delay 921 and multiplying the output signal by the coefficient cos θ, together with a signal coming from a loop fed back from the output 913, the feedback loop comprising the unity delay 910 and multiplying the output signal by a coefficient sin θ.

FIG. 6-B illustrates a modeling step following the step described above for a complex integrator without substantial delay according to one embodiment of the present invention. Such an integrator comprises two inputs 901 and 902, in addition to two outputs 913 and 923. The input signal has a real component ER and an imaginary component EX. On the channel I, the signal ER from the input 901 is added by the adder 903 to the signal r from the feedback loop 108 of the converter in order to deliver a signal 904. The latter is added to the signal 906 from a loop fed back from the output 913, the feedback loop comprising a unity delay 910 and multiplying the output signal by the coefficient (cos θ−1), to the signal 907 from a loop fed back from the output 913, the feedback loop comprising a unity delay 912 and lastly to the signal 908 from a loop fed back from the output 923 of the integrator, the feedback loop comprising a unity delay 921 and multiplying the output signal by the coefficient −sin θ.

On the channel Q, the signal EX from the input 902 is added by the adder 914 to the signal x from the feedback loop of the converter in order to deliver a signal 917. The latter is added by an adder 918 to the signal 920 from a loop fed back from the output 923, then to the signal 919 from the loop fed back from the output 923, and lastly to the signal 924 from the loop fed back from the output 913, each of these feedback loops comprising a delay of $Z^{-1}$ 922, 921, 912, respectively. The signal 924 is multiplied by the coefficient sin θ and the signal 920 is multiplied by the coefficient cos θ−1.

Figure 7:
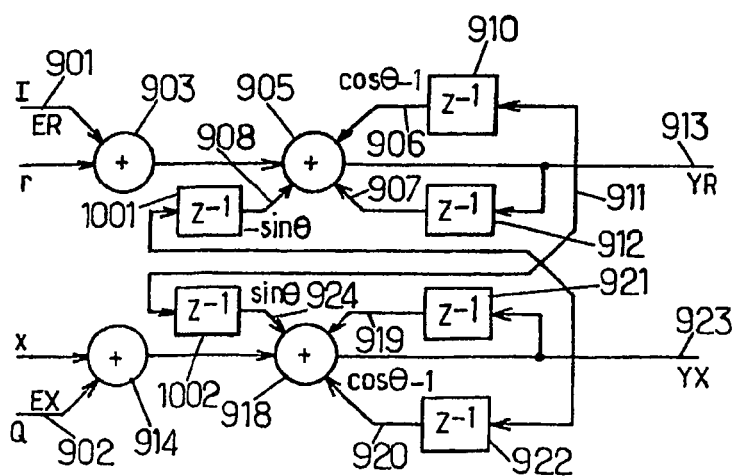
FIG. 7 is an intermediate modeling diagram for implementing the integrator modeled in FIG. 6.

FIG. 7 is a modeling that is closer to a possible implementation of the integrator according to FIG. 6. Thus, in FIG. 7, the modeling presented is, in all respects, identical to that presented in FIG. 6, with the exception of the modeling of the feedback loops for the signals 908 and 924, connecting the output of the imaginary channel to an adder on the real channel and vice versa, respectively. Thus, the loop fed back from the output 913 onto the adder 918 has a delay 1002 and the loop fed back from the output 923 onto the adder 905 has a delay 1001. Such a modeling allows an implementation circuit to be deduced more directly than from a modeling such as is shown in FIG. 6.

Figure 8:
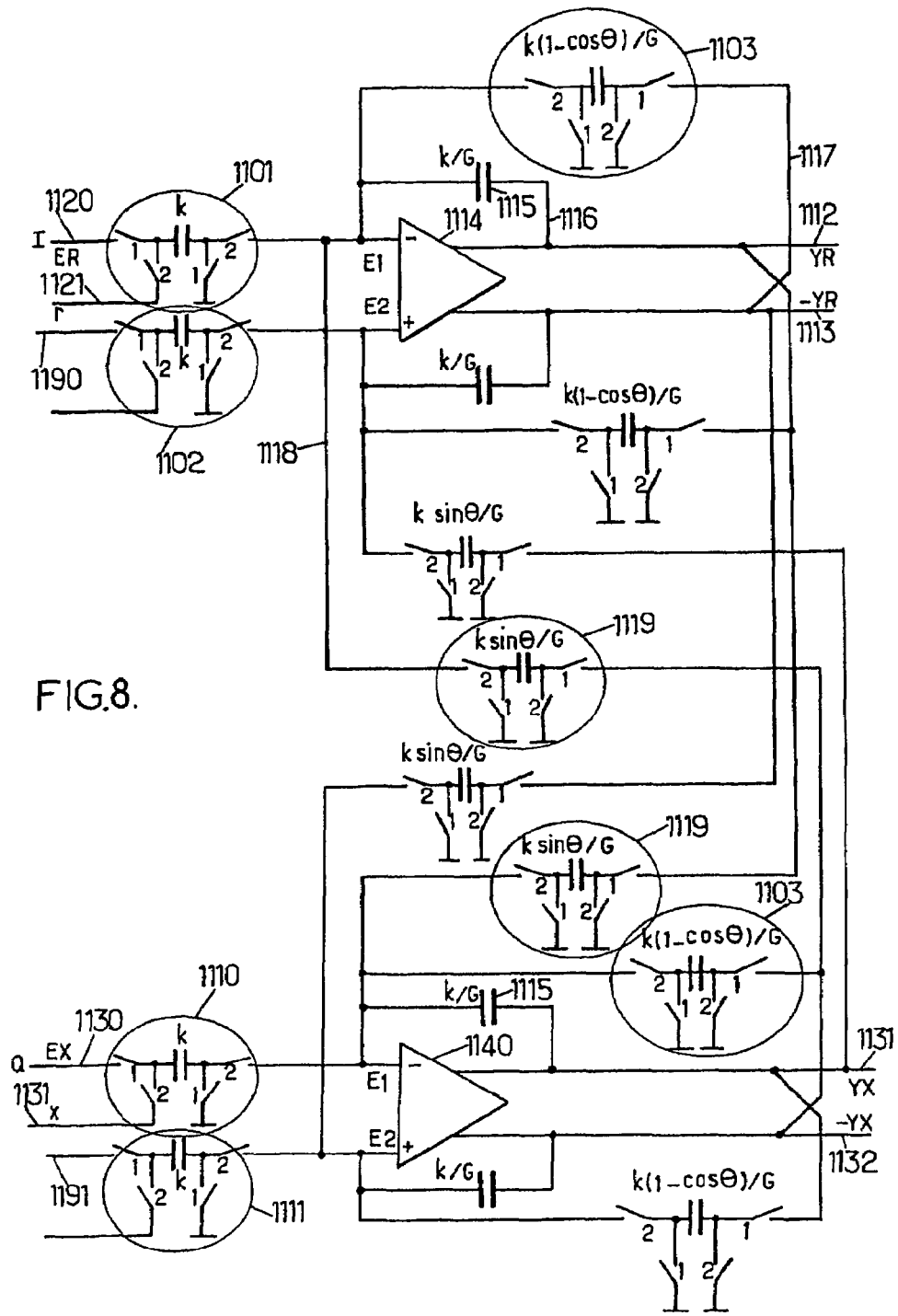
FIG. 8 is an implementation circuit diagram of a switched-capacitor integrator modeled FIG. 7.

Thus, starting from the modeling detailed herein above, FIG. 8 illustrates an implementation of an integrator without substantial delay according to one embodiment of the present invention.

Such an integrator therefore comprises an input 1120 for the real channel and an input 1130 for the imaginary channel of the complex converter, an input 1190 and respectively 1191, corresponding to the signal complementary to the input signal entering at the input 1120 and at the input 1130, respectively. It comprises an output 1112, together with a complementary output 1113, for the real channel, and an output 1131, together with a complementary output 1132, for the imaginary channel. Then, the integrator also comprises an input 1121 on the real channel, and respectively 1131 on the imaginary channel, corresponding to the feedback loop for receiving the feedback signal r of the channel I and the feedback signal x of the channel Q, respectively.

The following section describes the implementation of the components from the modeling of the integrator without delay in FIG. 7, only the real channel of the complex Sigma-Delta converter being described. Indeed, by symmetry and with reference to FIG. 7, the imaginary channel can readily be deduced from this.

Such an integrator is implemented with a first operational amplifier 1114 on the channel I and a second operational amplifier 1140 each having two inputs that are complementary to one another and two outputs that are complementary to one another.

Thus, the adder 903 is implemented by a unit 1101. In the first phase, the signal ER entering the real channel of the first stage is processed by a switched capacitor forming an entity referenced 1101. This processing is equivalent to the processing described with reference to FIG. 4 for the input of type I. Such a unit therefore allows the same processing to be applied to an input signal as the processing applied to the signal A entering an input of type I of a switched-capacitor integrator such as is illustrated in FIG. 4.

It is advantageous to reduce the thermal noise mainly in the first stage of a complex filter since this noise is not divided by the gain of preceding stages. For this purpose, in a preferred embodiment of the present invention, the input capacitor of the first stage is set at a relatively high value.

The values of the capacitors of one stage of the complex filter of a Sigma-Delta converter according to the invention can be chosen as a function of the number k. Such a number corresponds to a physical quantity with dimensions of Farads.

This unit 1101 is designed to perform the sampling of the input signal. It is advantageously also used for adding together the input signal and the feedback signal. Thus, the thermal noise is reduced by only using one capacitor for sampling one signal and adding together two signals. This can also be the case for the other units with input switched capacitor 1102, 1110 and 1111.

Thus, for the switched-capacitor unit 1101, in the first phase of operation (switch 1 closed and switch 2 open), the input signal 1120 charges up the corresponding capacitor of value k. Then, in the second phase of operation (switch 1 open and switch 2 closed) the signal from the feedback loop 1121 is added to the charge of the capacitor of value k. A sampling and an addition of two signals with a single switched-capacitor unit has thus been obtained.

The adder 905 is implemented by the first operational amplifier 1114 having a first input E1 receiving the signal ER processed by the unit 1101 and a second input E2 receiving the complementary signal of the first input. The feedback loop of the signal 906 comprising the unity delay 910 and multiplying the signal by a coefficient (cos θ−1) is implemented by a feedback loop 1117 that feeds back the complementary output 1113 onto the input E1 of the operational amplifier. This loop comprises a unit 1103 of same structure and same mode of operation as a switched-capacitor unit of type S, such as was previously described, including a capacitor of value k(1−cos θ)/G, G being equal to the gain of this integration stage without delay.

The feedback loop of the signal 907 comprising a unity delay 912 is implemented by a feedback loop 1116 comprising a capacitor 1115 of value k/G.

Then, the feedback loop of the signal 908 comprising a unity delay 1001 is implemented by a feedback loop 1118 feeding back the complementary output 1132 of the second operational amplifier 1140 of the imaginary channel onto the input E1 of the operational amplifier 1114. This feedback loop 1118 comprises a unit 1119 equivalent to the unit 1103 based on a capacitor of value k sin θ/G, which allows the signal of this loop to be assigned a coefficient of −k sin θ/G.

By symmetry of the real channel at the input E1 of the operational amplifier, the implementation of the real channel at the complementary input E2 of the operational amplifier 1114 is readily obtained.

Then, using the above and from the previous description presented with reference to FIG. 7, the implementation of the imaginary channel of this integrator without substantial delay at the output according to one embodiment of the present invention is obtained.

The following section describes the operation of such an integrator according to the phases of operation according to the implementation circuit diagram in FIG. 8. Thus, in the first phase of operation, the input capacitor of the unit 1101 is charged with the input signal ER. Then, in the second phase, the discharge signal from the capacitor is added to the signal r from the feedback loop of the Sigma-Delta converter before being transmitted to the operational amplifier 1114.

It is noted that the signal r from the feedback loop of the converter and the input signal ER are advantageously added together via the unit 1101, that only comprises a single capacitor, thus allowing the number of capacitors in the converter to be limited and, consequently, allowing the thermal noise of the converter to be limited. This same is true for the switched-capacitor units 1102, 1110, 1111.

The switched-capacitor units included in the feedback loops operate such that their capacitor charges up in the second phase of operation and discharges in the first phase of operation, in contrast to the capacitors of the other switched-capacitor units 1101,1102,1110,1111, which charge up in the first phase and discharge in the second phase.

Such an integrator without substantial delay is advantageously included in the first stage of the Sigma-Delta converter in one embodiment of the present invention. Since the thermal noise of each stage is divided by the gain of the preceding stages, the thermal noise of the first stage is not divided. As a result, it is important that the first stage generate a low thermal noise. For this purpose, since the thermal noise of a capacitor is inversely proportional to the capacitor value, it is therefore advantageous to have an input capacitor for the first stage of the filter with a high value, as previously indicated.

Then, a complex filter according to one embodiment of the present invention requires, for the last stage, an integration stage with a delay displaced into the feedback loop of the converter.

In one embodiment of the present invention, the complex filter of the converter comprises a first and a second stages as illustrated in FIG. 2. The present invention covers complex filters of complex Sigma-Delta converters comprising more than two stages. In that case, the first stage contains no substantial delay at the output and the last stage comprises a delay displaced to the output of the complex filter, as previously indicated.

Thus, whatever the number of stages of the filter of a converter according to an embodiment of the invention, the last stage is preferably an integrator with a delay displaced to the output of the filter.

The following sections therefore detail an integrator with a displaced delay according to one embodiment of the present invention.

Such an integrator has a transfer function obeying the following equations:

$$YR(1-\cos\theta*Z^{-1})=(ER+r)\cos\theta*Z^{-1}-(EX+x+YX)\sin\theta*Z^{-1}$$

$$YX(1-\cos\theta*Z^{-1})=(EX+x)\cos\theta*Z^{-1}+(ER+r+YR)\sin\theta*Z^{-1}$$

From the preceding equations, the following equations are obtained:

$$YR-YR*Z^{-1}=(ER+r)*\cos\theta*Z^{-1}-(EX+x+YX)*\sin\theta*Z^{-1}+\cos\theta*YR*Z^{-1}-YR*Z^{-1}$$

$$YX-YX*Z^{-1}=(EX+x)*\cos\theta*Z^{-1}+(ER+r+YR)*\sin\theta*Z^{-1}+\cos\theta*YX*Z^{-1}-YX*Z^{-1}$$

A division by the common factor $(1-Z^{-1})$ allows the equations for the outputs YR and YX to be written as a sum of components that can be implemented via switched capacitors as follows:

$$YR(1-Z^{-1}) = (ER+r)*\cos\theta*Z^{-1} -$$
$$(EX+x)*\sin\theta*Z^{-1} - YX*\sin\theta*Z^{-1} - (1-\cos\theta)*YR*Z^{-1}$$

$$YX(1-Z^{-1}) = (EX+x)*\cos\theta*Z^{-1} + (ER+r)*\sin\theta*Z^{-1} +$$
$$YR*\sin\theta*Z^{-1} - (1-\cos\theta)*YX*Z^{-1}$$

$$YR = \frac{(ER+r)*\cos\theta*Z^{-1}}{1-Z^{-1}} - \frac{(Er+x)*\sin\theta*Z^{-1}}{1-Z^{-1}} -$$
$$\frac{YX*\sin\theta*Z^{-1}}{1-Z^{-1}} - \frac{(1-\cos\theta)*YR*Z^{-1}}{1-Z^{-1}}$$

$$YX = \frac{(EX+x)*\cos\theta*Z^{-1}}{1-Z^{-1}} + \frac{(ER+r)*\sin\theta*Z^{-1}}{1-Z^{-1}} +$$
$$\frac{YR*\sin\theta*Z^{-1}}{1-Z^{-1}} - \frac{(1-\cos\theta)*YX*Z^{-1}}{1-Z^{-1}}.$$

FIG. 9-A illustrates a modeling of such an integration stage referenced 502 in FIG. 2. Such an integration stage comprises an input 1230 on the real channel with which an output 1211 is associated and an input 1231 on the imaginary channel with which an output 1212 is associated. On the real channel, an adder 1201 adds the signal at the input ER, the signal r from the feedback loop 108 of the Sigma-Delta converter together with a signal 1203 coming from the output 1211 on the real channel of the integration stage. At the output of the adder 1201, the signal is delayed by a unity delay 1209 then multiplied by a coefficient equal to cos θ, before being added by an adder 1204 to a signal 1208 coming from the imaginary channel. The signal 1208, resulting from the addition of the imaginary input signal and of the corresponding feedback signal x, then delayed by a delay 1210, is multiplied by a coefficient −sin θ.

By symmetry, the processing applied to the signal entering the input 1231 of the imaginary channel is obtained, except that the signal 1207, symmetric with the signal 1208, is multiplied by a coefficient sine and not a coefficient −sin θ.

FIG. 9 B illustrates an intermediate modeling that is closer to a possible implementation. Thus, on the real channel, the adder 1201 adds together the input signal of the stage and the feedback signal r of the converter in order to deliver a signal 1244 multiplied by a coefficient equal to cos θ. An adder 1240 adds together the signal 1244 and a signal 1254 coming from the imaginary channel multiplied by a coefficient −sin θ in order to deliver a signal 1241. An adder 1242 adds together the latter with the signal 1245 from output 1211 multiplied by a coefficient cos θ and also with a signal 1246 resulting from the multiplication by a coefficient −sin θ of the output signal 1212 on the channel Q of this integrator in order finally to deliver the output signal 1211 of this integrator on the channel I.

From the above and from the description presented with reference to FIG. 9-A, an equivalent modeling of the channel Q is readily obtained.

Figure 10:
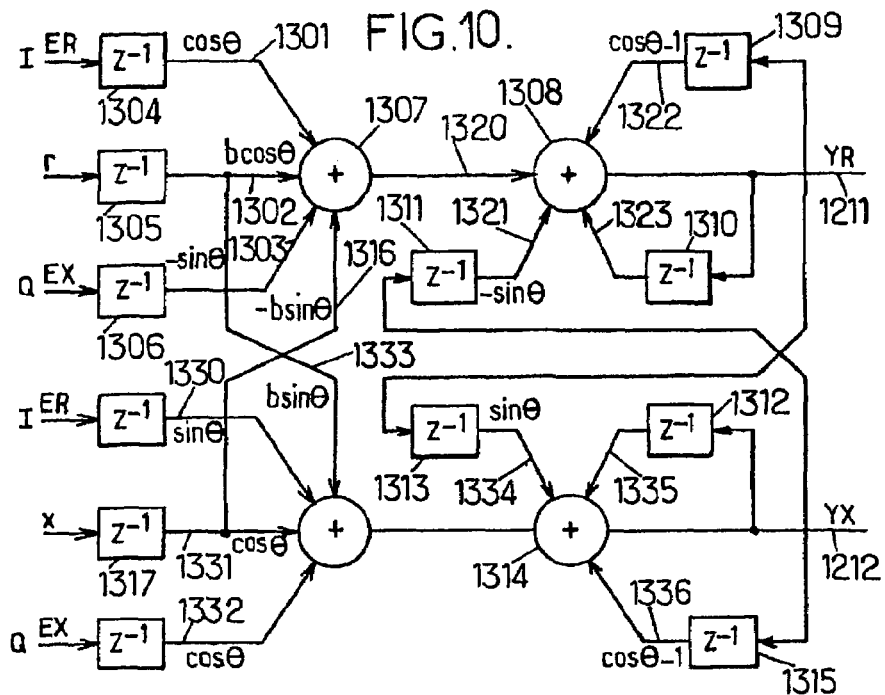
FIG. 10 is a modeling diagram for an implementation of a stage following the second stage in a complex filter of order strictly greater than 2 according to one embodiment of the present invention.

FIG. 10 shows a modeling close to a possible implementation of the last integration stage of a third-order complex filter of a Sigma-Delta converter according to one embodiment of the present invention. More generally, such a modeling can be advantageously applied to any stage following the second stage in a complex filter of order strictly higher than 2.

The following section describes the modeling of the real channel, that of the imaginary channel being readily deduced from the previous descriptions.

Thus, on the real channel, an adder 1307 adds together a signal ER at the input of the stage, delayed by a unity delay 1304 and multiplied by a coefficient cos θ, the signal r of the feedback loop 108 of the converter delayed by a unity delay 1305 and multiplied by a coefficient b cos θ, an input signal EX output from the imaginary channel of the preceding stage delayed by a unity delay 1306 and multiplied by a coefficient −sin θ and finally a signal 1316 resulting from a unity delay 1317 in the signal x from the feedback loop of the imaginary channel 115 and multiplied by a coefficient −b sin θ. An adder 1308 subsequently adds the signal 1320 output from the adder 1307 together with the signal 1322 from output YR of the channel I delayed and multiplied by a coefficient cos θ−1 via a feedback loop from the output 1211 comprising a unity delay 1309, and also with the output signal 1321 fed back from the output 1211 and delayed by a unity delay 1310 and lastly with the imaginary output signal YX fed back from the output 1212, multiplied by the coefficient −sin θ and delayed by a unity delay 1311. It is noted that each of the inputs includes a delay $Z^{-1}$, 1304 to 1306 for the real channel.

From the description presented with reference to FIG. 9 and by symmetry of the processing of the signal described above on the real channel, a modeling of the imaginary channel is readily obtained. However, it is noted notably that the coefficient applied to the feedback loop signal 1316 and 1321, respectively, is of the opposite sign to the coefficient applied to the signal 1333 and 1334, respectively.

Figure 11:
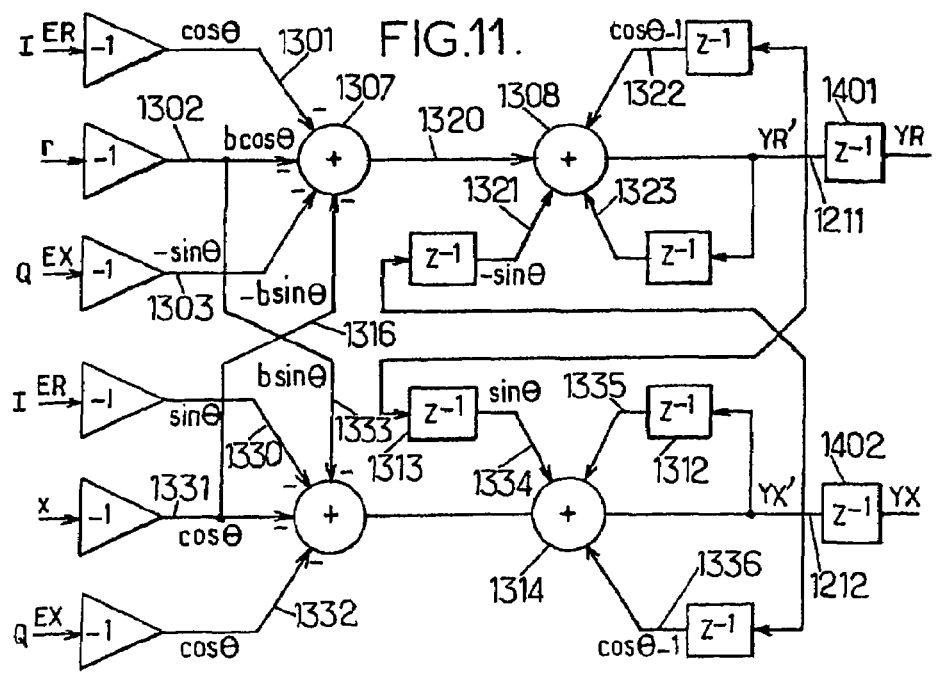
FIG. 11 is a modeling diagram for an implementation of a second stage of a complex filter according to one embodiment of the present invention.

Then, from the modeling in FIG. 10, a modeling illustrated in FIG. 11 is readily obtained. Indeed, the modeling shown in FIG. 11 is, in every respect, identical to the modeling in FIG. 10, except for the delays $Z^{-1}$ of the inputs. It advantageously corresponds to a second stage of a complex filter according to one embodiment of the invention. Indeed, the delay $Z^{-1}$ introduced at the input of the integrator stage in the modeling in FIG. 10 is displaced to the output of the integrator in the modeling in FIG. 11. Thus, a unity delay 1401 is introduced at the output 1211 of the real channel and a unity delay 1402 is introduced at the output 1212 of the imaginary channel. Such a modeling therefore allows the delay $Z^{-1}$ to be displaced to the output of the complex filter according to one embodiment of the invention such as is described with reference to FIG. 2.

Figure 12:
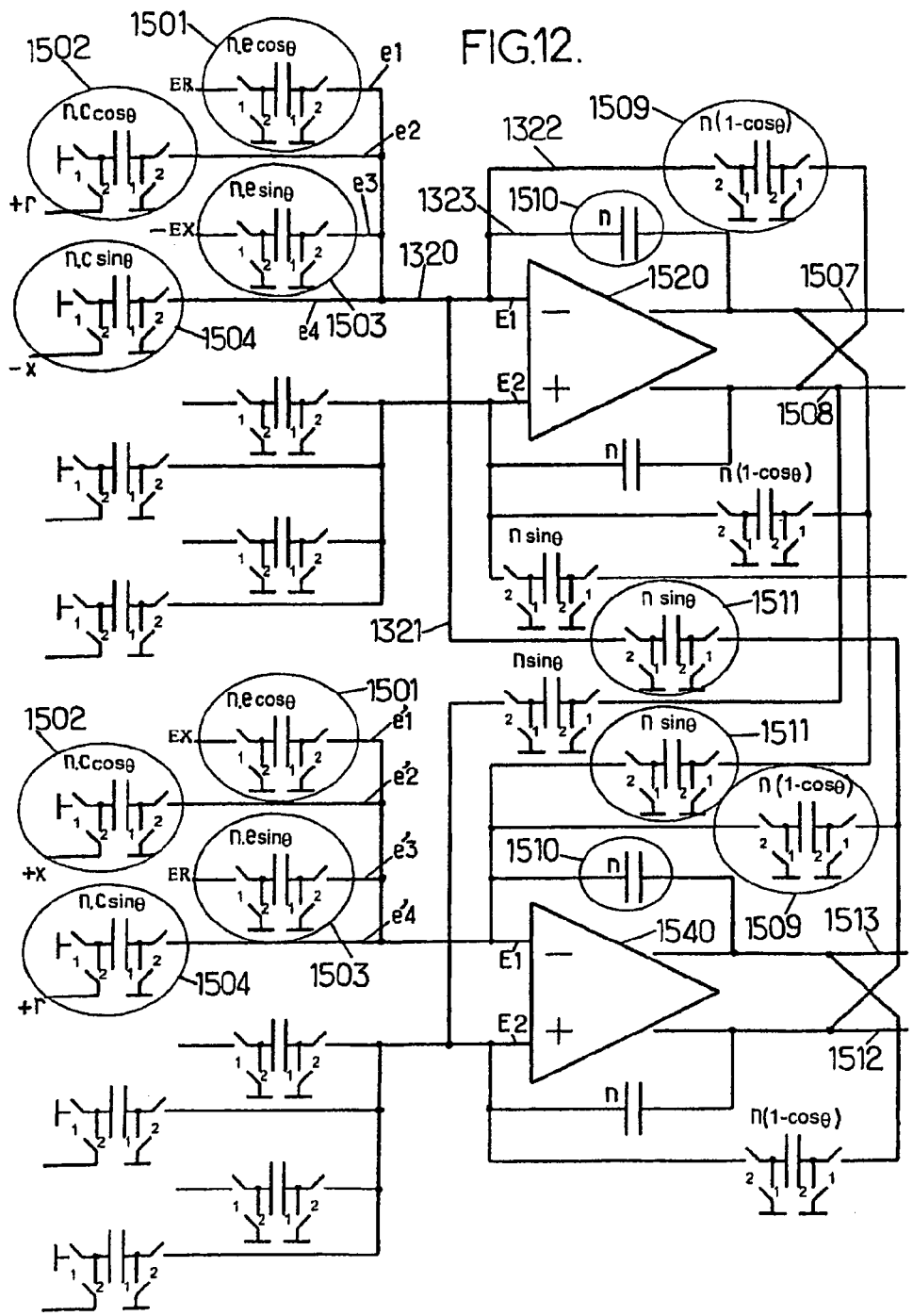
FIG. 12 is an implementation circuit diagram of a stage following the second stage in a complex filter of order strictly greater than 2 according to one embodiment of the present invention.

FIG. 12 is an implementation circuit diagram of an integration stage, preferably the last stage, of a complex filter of order strictly greater than 2 of a complex Sigma-Delta converter according to one embodiment of the present invention, or more generally, a stage following the second stage in a complex filter of order strictly greater than 2. Such a circuit is obtained using the modeling in FIG. 10.

It is noted that, at this stage, the signal output from the preceding stage of a complex filter according to one embodiment is multiplied by a coefficient e, and that the feedback signal is multiplied by a coefficient c. Thus, in the implementation circuit, these multiplier coefficients have been taken into account in order to determine the capacitor values.

The implementation circuit of one of the stages following the second stage of a complex filter according to one embodiment of the present invention comprises a first operational amplifier 1520 on the channel I and a second operational amplifier 1540 on the channel Q. Each operational amplifier has two inputs E1 and E2 that are complementary to one another, together with two outputs 1507,1508 and 1513,1512.

The addition of the four signals 1301, 1302, 1303 and 1316 by the adder 1307, delivering the signal 1320, is implemented by an operational amplifier 1520 that receives four signals coming from the inputs e1 to e4 at one input E1.

Thus, the signal 1301 is obtained at the input e1 which comprises a switched-capacitor unit 1501. The latter is based on a capacitor of value n*e cos θ and applies a processing equivalent to the unit 1101 previously described. In the first phase of operation, the signal from the real channel is therefore received. In one embodiment of the invention, the input e1 receives the signal from the real channel of the preceding stage. It is noted that n is a number that is strictly positive and relates to dimensions of capacitor (in Farads)

The signal 1302 is obtained at the input e2 which comprises a switched-capacitor unit 1502. The latter is based on a capacitor of value n*c cos θ. The input e2 receives the signal r from the feedback loop 114 of the Sigma-Delta converter. The signal r passes without delay through the switched-capacitor unit 1502 in the second phase of operation.

The signal 1303 is obtained at the input e3 which comprises a switched-capacitor unit 1503, equivalent to the unit 1501, which is based on a capacitor of value n*e sin θ. In one embodiment of the above, the input e3 receives the complementary output signal of the preceding stage on the imaginary channel.

The signal 1316 is obtained at the input e4 which comprises a switched-capacitor unit 1502, equivalent to the unit 1501, which is based on a capacitor of value n*c sin θ. The input e4 receives the complementary channel signal from the imaginary feedback loop of the Sigma-Delta converter.

Then, the addition of the four signals 1320, 1321, 1322 and 1323 by the adder 1308 is implemented by the amplifier 1520 that receives at its input E1 four signals as detailed below.

Thus, the signal 1320 is obtained as previously detailed.

Then, the signal 1321 is obtained via a loop fed back from the complementary output 1512 of the second operational amplifier 1540 on the imaginary channel, this feedback loop comprising a switched-capacitor unit 1511, equivalent to the unit 1103, which is based on a capacitor of value n*sin θ.

The signal 1323 is obtained via a loop fed back from the output 1507 of the amplifier 1520 of the real channel, this feedback loop comprising a capacitor 1510 of value n. This capacitor is an integration capacitor which is preferably allocated the highest value within this integration stage.

Then, the signal 1322 is obtained via a loop fed back from the complementary output 1508 of the operational amplifier 1520. This feedback loop comprises a switched-capacitor unit 1509, equivalent to the unit 1103, for which the value of the capacitor is equal to n*(1−cos θ).

By symmetry of the real channel at the input E1 of the operational amplifier, the implementation of the real channel at the complementary input E2 of the operational amplifier 1520 is readily obtained.

Then, from the description of the real channel, the implementation of the imaginary channel of this integrator without substantial delay at the output according to one embodiment of the present invention is obtained, by transferring correctly the values of the coefficients.

Thus, an input $e'_1$ comprises the switched-capacitor unit 1501 that receives the imaginary channel signal from the preceding stage in the first phase of operation. An input $e'_2$ comprises the switched-capacitor unit 1502 that receives the signal from the imaginary feedback loop in the second phase of operation. Then, an input $e'3$ comprises the switched-capacitor unit 1503 that receives the real channel signal from the preceding stage in the first phase of operation. Lastly, an input $e'4$ comprises the switched-capacitor unit 1504 that receives the signal from the real feedback loop in the second phase of operation.

FIG. 13 is an implementation circuit diagram of a second stage of a complex filter according to one embodiment of the present invention. It is noted that, at this stage, the signal output from the first stage of a complex filter according to one embodiment is multiplied by a coefficient d, then the feedback signal is multiplied by a coefficient b. Thus, in the implementation circuit, these multiplier coefficients have been taken into account in order to determine the capacitor values Such an implementation circuit is close to an implementation circuit of a stage positioned in front of the third stage in a filter of order strictly greater than 2 such as was previously described with reference to FIG. 12.

Indeed, the essential differences are localized at the inputs of the second stage, the other features being similar to those described with reference to FIG. 12. The following sections therefore describe the inputs e1, e2, e3 and e4 of the first input of the first operational amplifier 1520, the characteristics of the corresponding inputs on the second input of the operational amplifier being readily deduced from these.

Thus, the input e1 comprises a switched capacitor unit 1601 based on a capacitor of value n*d cos θ. Such an input receives the real channel complementary output signal from the first stage in the second phase of operation.

The input e2 comprises a switched-capacitor unit 1602 based on a capacitor of value n*b cos θ. Such an input receives the signal from the real feedback loop in the second phase of operation.

The input e3 comprises a switched capacitor unit 1603 based on a capacitor of value n*d sin θ. Such an input receives the imaginary channel output signal from the first stage in the second phase of operation.

The input e4 comprises a switched-capacitor unit 1604 based on a capacitor of value n*b sin θ. Such an input receives the complementary signal from the imaginary feedback loop in the second phase of operation.

Then, on the imaginary channel, inputs $e'_1$, $e'_2$, $e'_3$ and $e'_4$ are connected to the first input E'1 of the second operational amplifier 1540. Thus, the input $e'_1$ comprises the switched-capacitor unit 1601. It receives the imaginary channel complementary output signal from the first stage in the second phase of operation.

The input $e'_2$ comprises the switched-capacitor unit 1602. It receives the signal from the imaginary feedback loop in the second phase of operation.

The input $e'_3$ comprises the switched-capacitor unit 1603. It receives the real channel complementary output signal from the first stage in the second phase of operation.

The input $e'_4$ comprises the switched-capacitor unit 1604. It receives the signal from the real feedback loop in the second phase of operation.

It is noted that, advantageously, the input signals of such a second stage of a complex filter according to the invention are received in the second phase of operation of the switched-capacitor units without delay.

Thus, the preceding sections have detailed an implementation of a first stage and of a last stage of a complex filter of a multi-bit complex bandpass Sigma-Delta converter according to one embodiment of the present invention that avoids the need for having a delay after the sampling of the signal in the processing of the first stage and allows a delay to be introduced at the output of the complex filter of the Sigma-Delta converter.

In order to increase the performance of such a Sigma-Delta converter, in one embodiment, an analog-digital converter based on a comparator having a relatively short response time is used. For this purpose, a comparator that compares in common mode is used, which allows an analog-digital conversion with a high performance.

Furthermore, the switched-capacitor units comprise at least one capacitor and one switch function for controlling the charging and discharging of the capacitors. The structure of a device according to one embodiment of the present invention allows the switch functions of several switched-capacitor units advantageously to be 'factorized'. Indeed, the switch functions of a switched-capacitor unit placed at the input of an operational amplifier can be used to control the charging and the discharging of the capacitors of the corresponding integration switched-capacitor units, placed in the feedback loops. Thus, the noise generated by the resistance of such switches can advantageously be further reduced.

The invention claimed is:

1. A conversion method for an analog-digital conversion device having two channels, I and Q respectively, in quadrature, each comprising an input and an associated output, for converting a complex analog input signal into a complex digital output signal by an analog-digital converter, each output being fed back onto said associated input so as to form a first and a second feedback loops each comprising a digital-analog converter, said device comprising a complex filter with a first stage and a last stage, said method comprising, on each of said channels, the steps consisting in:

sampling an analog input signal;

performing a signal integration of the sampled signal in said first stage of the filter in order to deliver an output signal from the first stage, said integration not introducing any substantial delay;

performing a signal integration in the last stage of the filter in order to deliver an output signal from the last stage;

introducing a substantial delay at the output of the last stage and converting the output signal from the last stage into a digital signal over several bits by said analog-digital converter;

injecting said digital signal into the feedback loop of said channel;

converting the digital signal into a feedback signal by said digital-analog converter;

injecting said feedback signal into at least said first stage of said complex filter wherein the step consisting in performing a signal integration in the first stage of the complex filter comprises the steps consisting in:

adding together the following signals on the channel I:
the input signal of the channel I,
the feedback signal of the channel I, the output signal of the first stage of the channel I substantially delayed and multiplied by a coefficient 1/G, the output signal of the first stage of the channel I substantially delayed and multiplied by a coefficient of value 1/G*(cos θ−1), and the output signal of the first stage of the channel Q substantially delayed and multiplied by a coefficient 1/G*(−sin θ);

adding together the following signals on the channel Q:
the input signal of the channel Q,
the feedback signal of the channel Q,
the output signal of the channel Q of the first stage substantially delayed and multiplied by a coefficient of value 1/G
the output signal of the channel Q of the first stage substantially delayed and multiplied by a coefficient of value 1/G*(cos θ−1), and
the output signal of the channel I of the first stage substantially delayed and multiplied by a coefficient 1/G*(sin θ);

where θ is equal to 2πfz/fs, where fz is a frequency corresponding to a zero of the transfer function of the filter and fs is the sampling frequency of the signal;

where G is the gain of the first stage.

2. The method as claimed in claim 1, according to which a substantial delay is introduced into the feedback loop, the sum of said substantial delay in the feedback loop and of the substantial output delay of the last stage corresponding to a unity delay.

3. The method as claimed in claim 1, according to which the first stage of the complex filter is an integrator with switched capacitors and according to which the values of the capacitors are determined as a function of a given noise level.

4. The method as claimed in claim 1, according to which the stages of the complex filter other than the first stage are switched-capacitor stages, according to which the feedback signal is injected into each of the stages of the complex filter, and according to which the values of the capacitors are determined as a function of a given level of symmetry between the two channels I and Q, and/or of a given level of stability of the device.

5. The method as claimed in claim 1, according to which in the step consisting in performing a signal integration in a filter of order greater than or equal to 2, in the second stage respectively, in a stage following the second stage when it is possible, the signal at the input of said stage, respectively at the output of said stage, is substantially delayed;

said method comprising the steps consisting in:
adding together the following signals on the channel I:
the output signal of the preceding stage of the channel I multiplied by a coefficient of value d cos θ;
the feedback signal of the channel I multiplied by a coefficient of value b cos θ;
the output signal of the preceding stage of the channel Q multiplied by a coefficient −d sin θ;
the feedback signal of the channel Q multiplied by a coefficient of value −b sin θ;
the output signal of the last stage of the channel Q substantially delayed and multiplied by a coefficient −sin θ;
the output signal of the last stage of the channel I substantially retarded and multiplied by a coefficient of value cos θ−1; and
the output signal of the last stage of the channel I substantially retarded;

adding together the following signals on the channel Q:
the output signal of the preceding stage of the channel Q multiplied by a coefficient of value b cos θ;
the feedback signal of the channel Q multiplied by a coefficient of value b cos θ;
the output signal of the preceding stage of the channel I multiplied by a coefficient d sin θ;
the feedback signal of the channel I multiplied by a coefficient of value b sin θ;
the output signal of the last stage of the channel I substantially delayed and multiplied by a coefficient sin e;
the output signal of the last stage of the channel Q substantially delayed and multiplied by a coefficient of value cos θ−1; and
the output signal of the last stage of the channel Q substantially retarded;

where θ is equal to $2\pi f_z/f_s$, where $f_z$ is a frequency corresponding to a zero of the transfer function of the filter and $f_s$ is the sampling frequency of the signal;

and where b and d are numbers that are strictly positive.

6. A multi-bit analog-digital conversion device having two channels in quadrature, I and Q respectively, each comprising an input and an associated output, for converting a complex analog input signal into a complex digital output signal over several bits, each output being fed back onto said associated input so as to form a first and a second feedback loops each comprising a digital-analog converter, said device comprising:

a complex filter comprising a first stage and a last stage, said first stage comprising an integrator without substantial delay;

an analog-digital converter in each of the channels for converting the signal at the output of the complex filter; and an element with substantial delay disposed at the input of the analog-digital converter, wherein the first stage of the complex filter comprises a first operational amplifier respectively a second operational amplifier on the channel I respectively Q, each of the amplifiers comprising a first input and a second input, complementary to said first input, and a first output and a second output, complementary to said first output;

the first input of the first operational amplifier receiving an input signal on the channel I being connected to:
the feedback loop of the channel I via a link comprising a unit with switched capacitor of value k;
the first output of the first operational amplifier via a feedback loop comprising a capacitor of value k/G;
the second output of the first operational amplifier via a feedback loop comprising a switched-capacitor unit including a capacitor of value k/G*(1−cos θ); and
the second output of the second operational amplifier via a feedback loop comprising a switched-capacitor unit including a capacitor of value k/G*sin θ;

the second input of the first operational amplifier being designed to deliver a signal that is complementary to the signal delivered at the first output of the first operational amplifier; the first input of the second operational amplifier receiving an input signal on the channel Q being connected to:
the feedback loop of the channel Q via a link comprising a unit with switched capacitor of value k;
the first output of the second operational amplifier via a feedback loop comprising a capacitor of value k/G;

the second output of the second operational amplifier via a feedback loop comprising a switched-capacitor unit including a capacitor of value k/G*(1−cos θ); and the first output of the first operational amplifier via a feedback loop comprising a switched-capacitor unit including a capacitor of value k/G*sin θ;

where θ is equal to 2πfz/fs, where Fz is a frequency corresponding to a zero of the transfer function of the filter and fs is the sampling frequency of the signal; where G is the gain of the first stage; where k is a number that is strictly positive; the capacitors of said switched-capacitor units comprised in feedback loops being charged, respectively discharged, while the capacitors of the other switched-capacitor units being discharged, respectively charged; the second input of the second operational amplifier being designed to deliver a signal that is complementary to the signal delivered at the first output of the second operational amplifier.

7. The device as claimed in claim 6, wherein a first substantial delay is introduced at the output of the last stage and a second substantial delay is introduced in the feedback loop, the sum of said first and second substantial delays corresponding to a unity delay.

8. The device as claimed in claim 6, wherein the first stage of the complex filter is an integrator with switched capacitors and wherein said capacitors have relatively high values.

9. The device as claimed in claim 6, wherein the stages of the complex filter other than the first stage are switched-capacitor stages, wherein a link is provided for injecting the feedback signal into each of the stages of the complex filter, and wherein capacitor values of said stages are determined as a function of a given level of symmetry between the two channels I and Q, and/or of a given level of stability of the device.

10. The device as claimed in claim 6, wherein the switched-capacitor unit of the link between the first input of the first operational amplifier, respectively of the second operational amplifier, and the feedback loop of the channel I is also used for sampling the input signal of the channel I, and wherein the switched-capacitor unit of the link between the second input of the first operational amplifier, respectively of the second operational amplifier, and the feedback loop of the channel Q is also used for sampling the input signal of the channel Q.

11. The device as claimed in claim 6, wherein the complex filter is of order strictly greater than 2, and wherein one of the stages following the second stage of the complex filter comprises a first operational amplifier, respectively a second operational amplifier, on the channel I, respectively Q, each of the amplifiers comprising a first input and a second input complementary to said first input, and a first output and a second output, complementary to said first output;

the feedback loops each comprising a main channel for a feedback signal and a complementary channel for a complementary feedback signal;

the preceding stage delivering a first output of the channel I and, respectively of the channel Q, and a second complementary output of the channel I, respectively of the channel Q;

the first input of the first operational amplifier being connected to:

the first output of the channel I of the preceding stage via a link comprising a switched-capacitor unit including a capacitor of value n*e cos θ;

the main channel of the feedback loop of the channel I via a link comprising a switched-capacitor unit including a capacitor of value n*c cos θ;

the second output of the channel Q of the preceding stage via a link comprising a switched-capacitor unit including a capacitor of value n*c sin θ;

the complementary channel of the feedback loop of the channel Q via a link comprising a switched capacitor unit including a capacitor of value n*c sin θ;

the second output of the second operational amplifier via a link comprising a switched-capacitor unit comprising a capacitor of value n*sin θ;

the second output of the first operational amplifier via a link comprising a switched-capacitor unit comprising a capacitor of value n*(1−cos θ);

the first output of the first operational amplifier via a link comprising a capacitor of value n;

the second input of the first operational amplifier being designed to deliver a signal that is complementary to the signal delivered at the first output of the first operational amplifier;

the first input of the second operational amplifier being connected to:

the first output of the channel Q of the preceding stage via a switched-capacitor unit comprising a capacitor of value n*e cos θ;

the main channel of the feedback loop of the channel Q via a link comprising a switched-capacitor unit comprising a capacitor of value n*e cos θ;

the first output of the channel f of the preceding stage via a link comprising a switched-capacitor unit comprising a capacitor of value n*e sin θ;

the main channel of the feedback loop of the channel I via a link comprising a switched-capacitor unit comprising a capacitor of value n*c sin θ;

the first output of the first operational amplifier via a link comprising a switched-capacitor unit comprising a capacitor of value n*sin θ;

the second output of the second operational amplifier via a link comprising a switched-capacitor unit comprising a capacitor of value n(1−cos θ);

the first output of the second operational amplifier via a link comprising a capacitor of value n;

where e is equal to 2πfz/fs, where fz is a frequency corresponding to a zero of the transfer function of the filter and fs is the sampling frequency of the signal; where G is the gain of the first stage; where c, e, n are numbers that are strictly positive; the capacitors of said switched-capacitor units comprised in feedback loops being charged, respectively discharged, while the capacitors of the other switched-capacitor units being discharged, respectively charged;

the second input of the second operational amplifier being designed to deliver a signal that is complementary to the signal delivered at the first output of the second operational amplifier.

12. The device as claimed in claim 6, wherein the complex filter is of order greater than or equal to 2, and wherein a second stage of the complex filter comprises a first operational amplifier, and respectively a second operational amplifier, on the channel I, respectively Q, each of the amplifiers comprising a first input and a second input complementary to said first input, and a first output and a second output, complementary to said first output;

the feedback loops each comprising a main channel for the feedback signal and a complementary channel for the complementary feedback signal;

the first stage delivering a first output of the channel I, respectively of the channel Q, and a second complementary output of the channel I, respectively of the channel Q;

the first input of the first operational amplifier being connected to:
- the second output of the first stage of channel I via a link comprising a switched-capacitor unit including a capacitor of value n*d cos θ;
- the main channel of the feedback loop of the channel I via a link comprising a switched-capacitor unit including a capacitor of value n*b cos θ;
- the first output of the channel Q of the first stage via a link comprising a switched-capacitor unit including a capacitor of value n*d sin θ;
- the complementary channel of the feedback loop of the channel Q via a link comprising a switched-capacitor unit including a capacitor of value n*b sin θ;
- the second output of the second operational amplifier via a link comprising a switched-capacitor unit comprising a capacitor of value n*sin θ;
- the second output of the first operational amplifier via a link comprising a switched-capacitor unit comprising a capacitor of value n*(1−cos θ);
- the first output of the first operational amplifier via a link comprising a capacitor of value n;

the second input of the first operational amplifier being designed to deliver a signal that is complementary to the signal delivered at the first output of the first operational amplifier;

the first input of the second operational amplifier being connected to:
- the second output of the channel Q of the first stage via a switched-capacitor unit comprising a capacitor of value n*d cos θ;
- the main channel of the feedback loop of the channel Q via a link comprising a switched-capacitor unit comprising a capacitor of value n*b cos θ;
- the second output of the channel I of the first stage via a link comprising a switched-capacitor unit comprising a capacitor of value n*d sin θ;
- the main channel of the feedback loop of the channel I via a link comprising a switched-capacitor unit comprising a capacitor of value n*b sin θ;
- the first output of the first operational amplifier via a link comprising a switched-capacitor unit comprising a capacitor of value n*sin θ;
- the second output of the second operational amplifier via a link comprising a switched-capacitor unit comprising a capacitor' of value n(1−cos θ);
- the first output of the second operational amplifier via a link comprising a capacitor of value n;

where θ is equal to 2π/Fs, where fz is a frequency corresponding to a zero of the transfer function of the filter and fs is the sampling frequency of the signal; where G is the gain of the first stage; where b, d, n are numbers that are strictly positive; the capacitors of said switched-capacitor units comprised in feedback loops being charged, respectively discharged, while the capacitors of the other switched-capacitor units being discharged, respectively charged;

the second input of the second operational amplifier being designed to deliver, a signal that is complementary to the signal delivered at the first output of the second operational amplifier;

signals received by said switched-capacitor units being transmitted with no delay to the respective inputs of the operational amplifier.

* * * * *